(12) United States Patent
Bhat

(10) Patent No.: US 7,064,353 B2
(45) Date of Patent: Jun. 20, 2006

(54) LED CHIP WITH INTEGRATED FAST SWITCHING DIODE FOR ESD PROTECTION

(75) Inventor: Jerome C. Bhat, San Francisco, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 92 days.

(21) Appl. No.: 10/855,277

(22) Filed: May 26, 2004

(65) Prior Publication Data

US 2005/0274956 A1    Dec. 15, 2005

(51) Int. Cl.
*H01L 27/15* (2006.01)
*H01L 21/00* (2006.01)

(52) U.S. Cl. .............................. 257/79; 257/99; 438/23
(58) Field of Classification Search .................. 257/79, 257/99, 103, 603; 438/23
See application file for complete search history.

(56) References Cited

U.S. PATENT DOCUMENTS

| 6,054,716 A | 4/2000 | Sonobe et al. |
| 6,333,522 B1 | 12/2001 | Inoue et al. |
| 6,521,914 B1 | 2/2003 | Krames et al. |
| 6,547,249 B1 | 4/2003 | Collins, III et al. |
| 6,593,597 B1 | 7/2003 | Sheu |
| 6,911,676 B1 * | 6/2005 | Yoo ............................ 257/93 |
| 6,958,498 B1 * | 10/2005 | Shelton et al. ................ 257/99 |
| 2003/0122139 A1 | 7/2003 | Meng et al. |

OTHER PUBLICATIONS

S.J. Chang et al., "Improved ESD Protection by Combining InGan-GaN MQW LEDs With GaN Schottky Diodes," IEEE Electron Device Letters, vol. 24, No. 3, Mar. 2003, pp. 129-131.

* cited by examiner

*Primary Examiner*—Mark V. Prenty
(74) *Attorney, Agent, or Firm*—Patent Law Group LLP; Brian D. Ogonowsky

(57) ABSTRACT

A relatively small ESD protection diode is formed on the same chip as a light emitting diode. In one embodiment, the ESD diode is a mesa-type diode isolated from the light emitting diode by a trench. To reduce the series resistance of the ESD diode, the PN junction and metal contact to the semiconductor material is made long and expands virtually the width of the chip. Various configurations of the PN junction and the N and P metal contacts for the ESD diode are described for increasing the breakdown voltage and for improved testing.

22 Claims, 4 Drawing Sheets

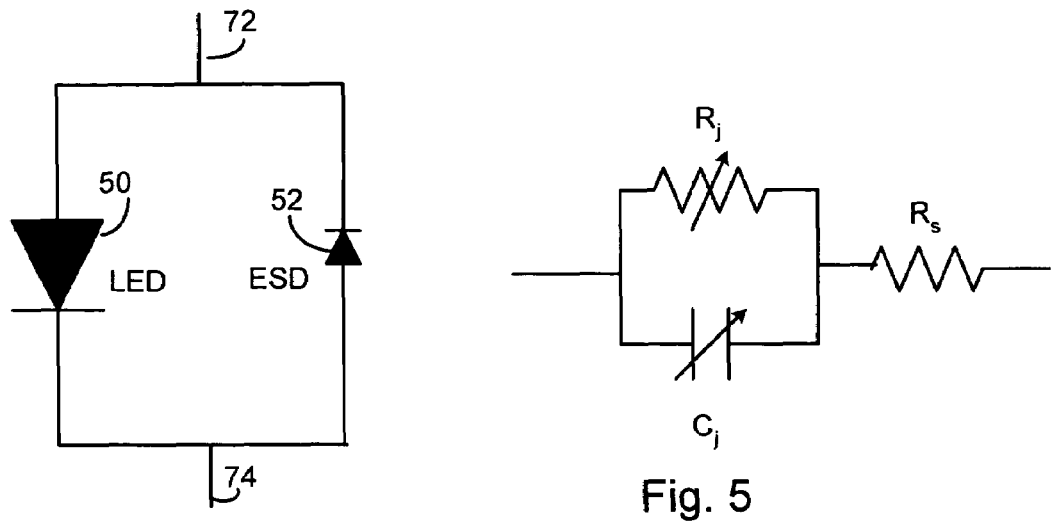
Fig. 4
Fig. 5
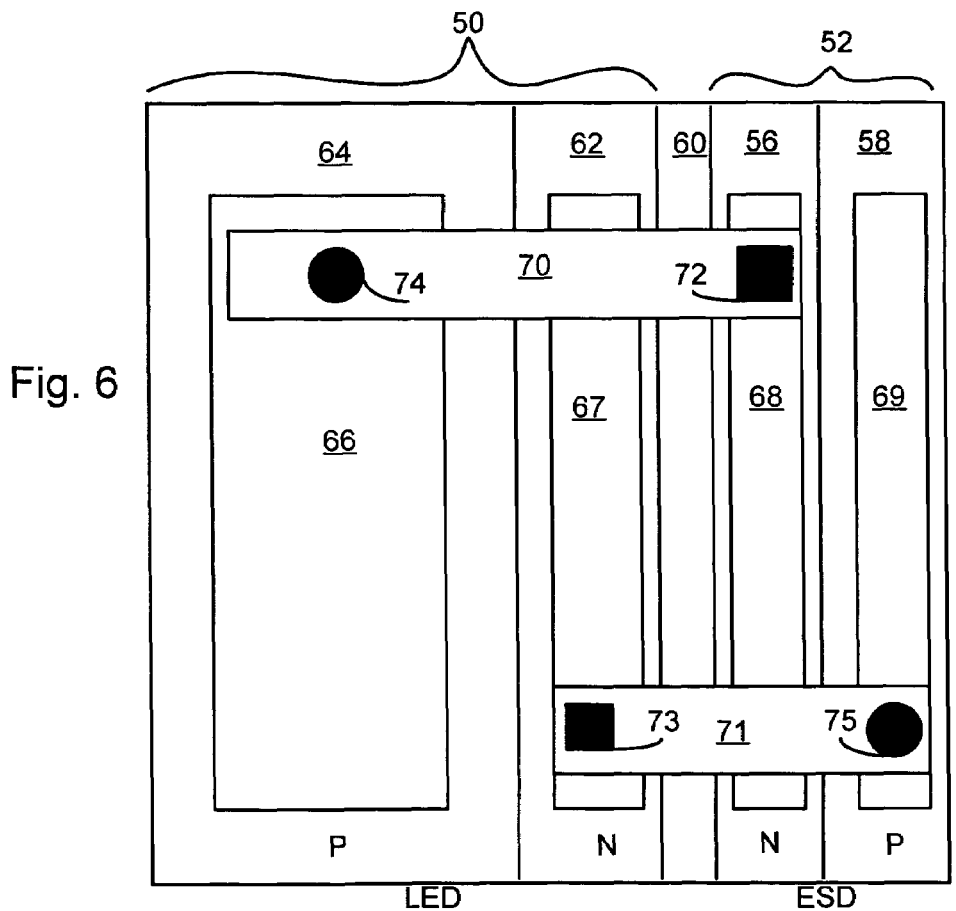
Fig. 6

LED CHIP WITH INTEGRATED FAST SWITCHING DIODE FOR ESD PROTECTION

FIELD OF THE INVENTION

This invention relates to light emitting diodes (LEDs) and, in particular, to electrostatic discharge (ESD) protection for LED chips.

BACKGROUND OF THE INVENTION

Providing ESD protection for LED chips is well-known and commonplace. LEDs, especially gallium nitride-based LEDs, are particularly susceptible to damage with a reverse bias voltage across its anode and cathode. ESD voltages in normal environments can exceed 10,000 volts.

One example of a way to provide ESD protection for an LED chip is illustrated in FIGS. 1–3, which are described in U.S. Pat. No. 6,547,249, issued to the present inventor and others. This patent is incorporated herein by reference. FIG. 1 illustrates two diodes formed on the same semiconductor chip connected in an anti-parallel configuration. LED 10 is forward biased in normal operation and emits light. Upon a reverse bias voltage being applied to the terminals of LED 10, the ESD protection diode 12 conducts so as to shunt current away from LED 10 and clamp the reverse bias voltage across LED 10 to the voltage drop across diode 12.

FIGS. 2 and 3 are a top-down view and a cross-sectional view, respectively, of one embodiment 40 of a monolithic ESD protection circuit described in the '249 patent.

Diode structures A and B are formed on a highly resistive substrate 20. One structure A is connected as an LED to produce light, while the other structure B is used to clamp reverse breakdown in LED A. P-type layers 41a and 41b overlay active regions 49a and 49b, which are formed on n-type layers 42a and 42b. A trench 43 is formed between devices A and B. Ledges for contact formation on n-type layers 42a and 42b are exposed such that the n-electrodes 45a and 45b are on opposite sides of trench 43. A dielectric layer 47 electrically insulates the metallization layer 46a from all electrical contact except where openings are made for interlayer interconnects, or for contacts to such areas as the p-contacts or n-contacts. P-electrode 44a and n-electrode 45b are connected by interconnect 46a such that the p-contact of LED A is connected to the n-contact of clamping device B. In the region where interconnect 46a is deposited, the n-contact of LED A is isolated from interconnect 46a by dielectric layer 47. As shown in FIG. 2., the interconnection between the p-contact of LED A and the n-contact of clamping device B is formed on one side of the device, and the interconnection between the n-contact of LED A and the p-contact of clamping device B is formed on the other side of the device. The structure can then be connected to a submount or other structure (not shown) by solder bumps or wire bonds 48.

One drawback associated with placing an ESD diode on the same chip as an LED intended to emit light is that the ESD diode uses up area on the chip, thus reducing the area and the light output of the light producing diode. Although the ESD diode may output light when forward biased, such light output is inconsequential to its ESD function. Another problem is that the high currents through the forward biased ESD diode must be carried through the series resistance of the diode. The series resistance includes the resistances of the metal and the bulk resistances of the N and P type material forming the ESD diode. The series resistance becomes very significant at high ESD currents since a relatively high voltage ($V=IR_s$) may be dropped across the series resistance. Additionally, the structures of FIGS. 1–3 do not allow the light emitting diode and ESD diode to be individually tested for quality and reliability since the interconnections are already made on the chip.

SUMMARY

An improved ESD protection circuit is disclosed herein. A relatively small ESD protection diode is formed on the same chip as a light emitting diode. In one embodiment, the ESD diode is a mesa-type diode isolated from the light emitting diode by a trench. The ESD diode is made much smaller than the light emitting diode so as to use less area.

To reduce the series resistance of the ESD diode, the contact area between the metal layer and the exposed N-type material is made long and expands virtually the width of the chip. Various configurations of the PN junction and the N and P metal contacts for the ESD diode are described for reducing the series resistance and increasing the breakdown voltage.

In one embodiment, the light emitting diode and ESD diode are not interconnected on the chip so that they may be individually tested before packaging. The interconnection of the diodes in the anti-parallel configuration is made external to the chip either in the package, in the chip mount, or in a submount.

The ESD diode design can readily be applied to gallium nitride flip chip LEDs and wire bonded LEDs.

BRIEF DESCRIPTION OF THE DRAWINGS

FIG. 4 is a schematic diagram of one embodiment of the present invention illustrating a small ESD protection diode on the same chip as a light emitting diode.

FIG. 5 is a schematic diagram illustrating the impedance of the ESD protection diode and the series resistance associated with the ESD protection diode.

FIG. 6 is a top-down view of one embodiment of the structure of FIG. 4.

DETAILED DESCRIPTION

Figure 1:
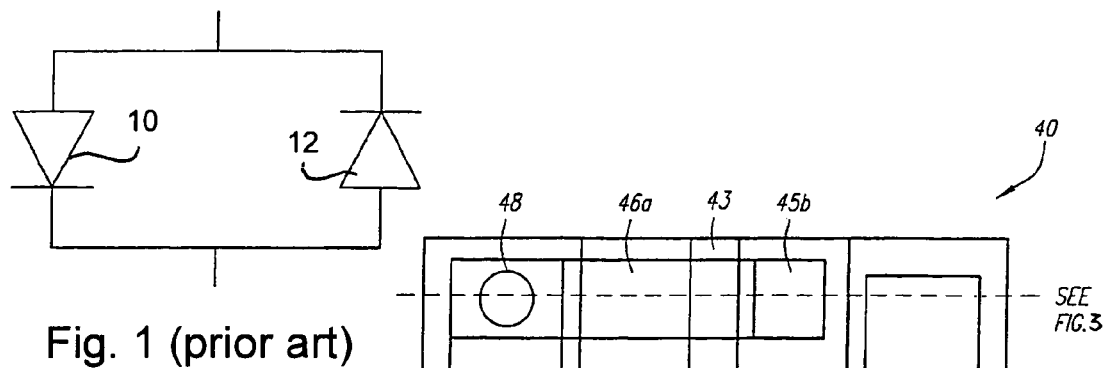
FIG. 1 is a schematic diagram of a prior art light emitting diode and an ESD protection diode formed on the same chip and connected in an anti-parallel configuration.
Figure 2:
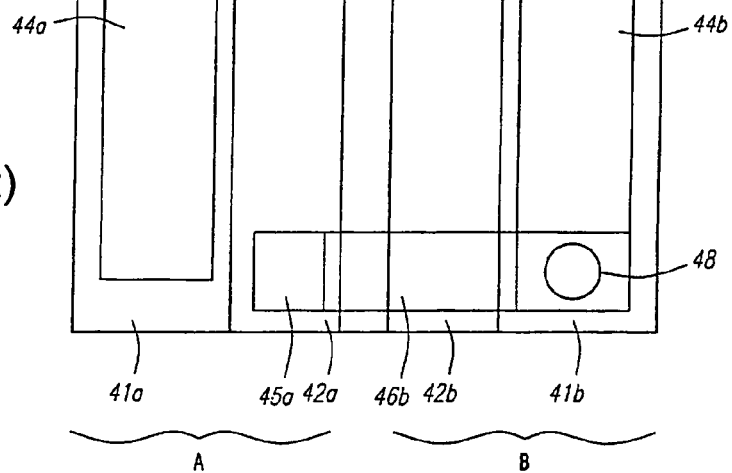
FIG. 2 is a top-down view of an LED chip implementing the configuration of FIG. 1.

FIG. 4 is a schematic diagram similar to FIG. 1 except that the light emitting diode 50 is shown to be much larger than the ESD protection diode 52. Since diode 52 is not needed for its light output, its area may be very small. In one embodiment, the area of the ESD diode is less than 30 percent of the area of the chip. This allows more area of the chip to be utilized by the light emitting diode 50.

FIG. 5 illustrates the impedance components of the ESD diode 52. The impedance of the PN junction is largely determined by the junction resistance $R_j$ and the junction capacitance $C_j$, where the impedance due to the capacitance is given by $Z=1/j\omega C_j$. This impedance remains largely invariant for a given junction area. However, the series resistance $R_s$ of the diode is highly dependent upon the layout of the ESD diode 52. The series resistance becomes very significant during shunting of the high ESD current since a voltage is dropped across the series resistance equal to $V=IR_s$. This voltage drop must remain low to not damage the light emitting diode 50.

Figure 3:
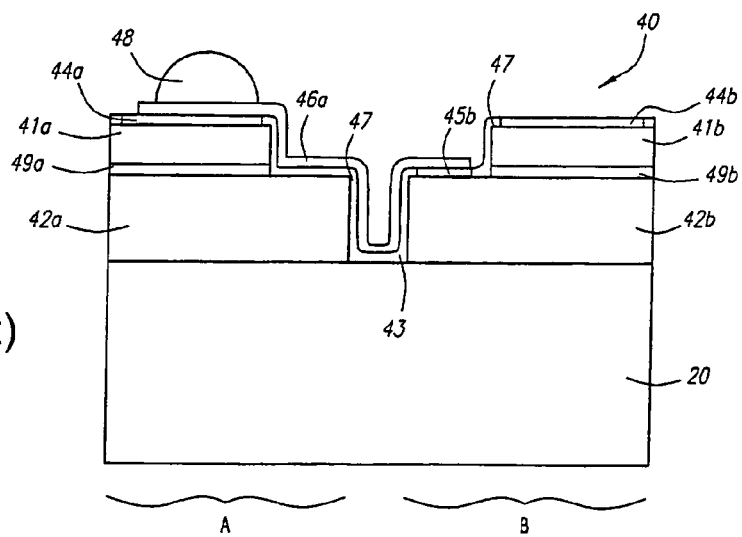
FIG. 3 is a cross-sectional view of the structure of FIG. 2 across the dashed line in FIG. 2.

FIG. 6 is a top down view of an LED chip that incorporates the LED 50 and ESD protection diode 52 of FIG. 4. Typically, to form the LED chip, N-epitaxial layers are grown over a substrate followed by growing active region layers, followed by growing P-epitaxial layers over the active region layers. The top layers are then etched to expose portions of the N-type material for metal contact. ESD diode 52 is isolated from LED 50 by a trench 60, similar to that shown in FIG. 3. The ESD protection diode 52 is formed by the junction of N-type material 56 and P-type material 58. The LED 50 is formed by the junction of the P-type material 64 overlying the N-type material 62, which forms a large light-emitting junction that has surface parallel to the surface of the wafer. Metal layers are then deposited and etched to make ohmic contact to the P and N-type layers. Typically, the P-contact metal is silver, and the N-contact metal is aluminum, titanium, or a titanium/gold alloy.

Each of the N and P-type materials is contacted by a metal layer portion 66, 67, 68, and 69. The metal portions 66–69 distribute the current over a large area of the semiconductor material. Metal interconnects 70 and 71 interconnect diodes 50 and 52 as shown in FIG. 4. A dielectric layer insulates the metal interconnects 70 and 71 from the underlying metal layers. The metal layers are attached to one another through vias 72 and 73 formed through the dielectric layer. Wire bond pads or solder bumps 74 and 75 are formed for bonding to wires or for direct bonding to a submount.

Although the area of diode 52 is small compared to the area of LED 50, the PN junction and the metal portion 68 and 69 span virtually across the entire width of the chip. By having a long edge of the PN junction contacted along almost its entire length by the metal portions 68 and 69, the N-bulk resistance part of the series resistance Rs of the ESD diode 52 is greatly reduced over that of a diode having the same PN junction area but having a shorter contact side. This allows the long and narrow ESD diode 52 to take up little chip area yet have a very small series resistance. In another embodiment, the metal layer portion contacting the N-type material spans at least 50 percent of the length of the PN junction.

In one embodiment, the chip area is 1–4 mm², where the ESD protection diode comprises less than approximately ten percent of the chip area. In one embodiment, the ESD protection diode has an area of between approximately 20,000 um² to 60,000 um² and can provide protection for reverse bias discharges of greater than approximately 2 kV. If the chip is to be used in ESD-rich environments, such as automotive applications, the size of the ESD diode may be increased to have an area of approximately 60,000 um² to 100,000 um² and be capable of shunting discharge voltages far greater than 2 kV. As the chip size is reduced for lower power output light emitting needs, such as for chips less than 1 mm², the ESD protection diode may comprise less than 30 percent of the chip area and provide protection for reverse bias discharges greater than approximately 600 volts.

In the preferred embodiments, the ESD diode 52 is a mesa-type diode having an aspect ratio of greater than approximately 2:1 to reduce the series resistance. Other methods of isolation can be used instead of trenches. For example, the diode 52 may be insulated using PN junction isolation by forming tubs or wells using ion implantation.

Figure 7:
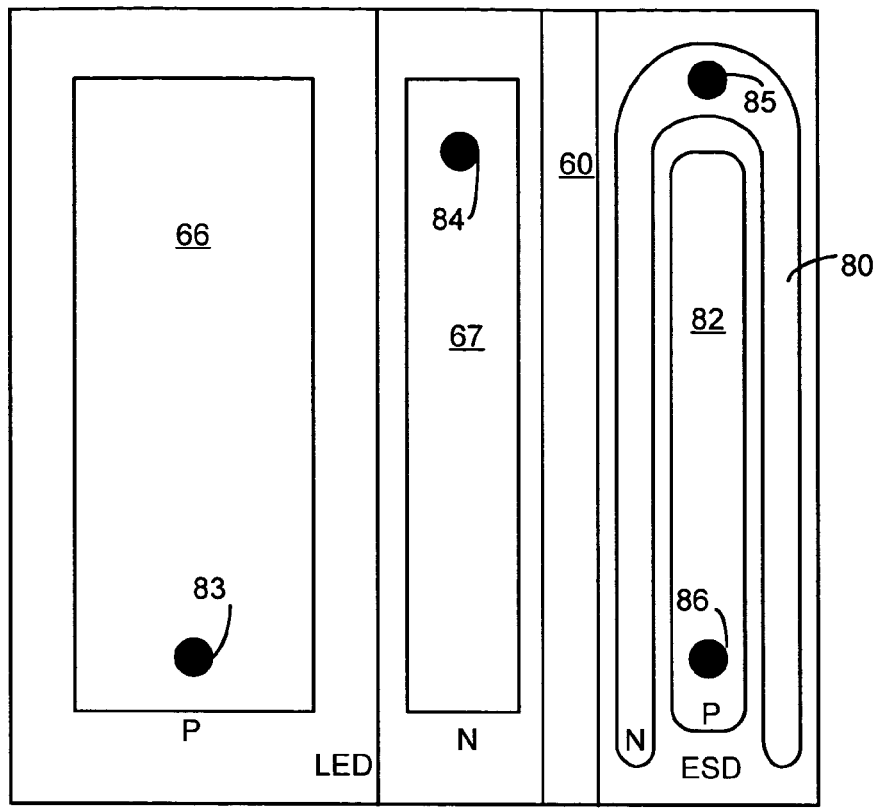
FIG. 7 is a top-down view of another embodiment of the structure of FIG. 4 without metal interconnections.

FIG. 7 is a top-down view of another embodiment of an LED and ESD protection diode formed on the same chip. To further reduce the series resistance, the N-type material underlying the P-type material is exposed around most of the periphery (exceeding 75%) of the P-type material and is contacted with metal portion 80. This effectively reduces the series resistance by 50 percent compared to the configuration shown in FIG. 6. FIG. 7 further shows a metal portion 82 overlying the P-type material.

A further difference between FIG. 7 and FIG. 6 is that the ESD diode metal portions and PN junction are formed so as not to have any sharp corners; all corners are rounded. The presence of corner features results in electric field concentration at those features. Minimizing the electric field concentration at the corners by rounding the corners allows larger ESD pulses to be discharged through the protection diode without causing failure of that diode.

To enable the LED and ESD protection diode to be fully tested during manufacture, the diodes are interconnected external to the chip after the complete manufacture of the chip. The dots 83–86 in FIG. 7 represent solder bumps or wire bond pads for the associated metal interconnects.

Figure 8:
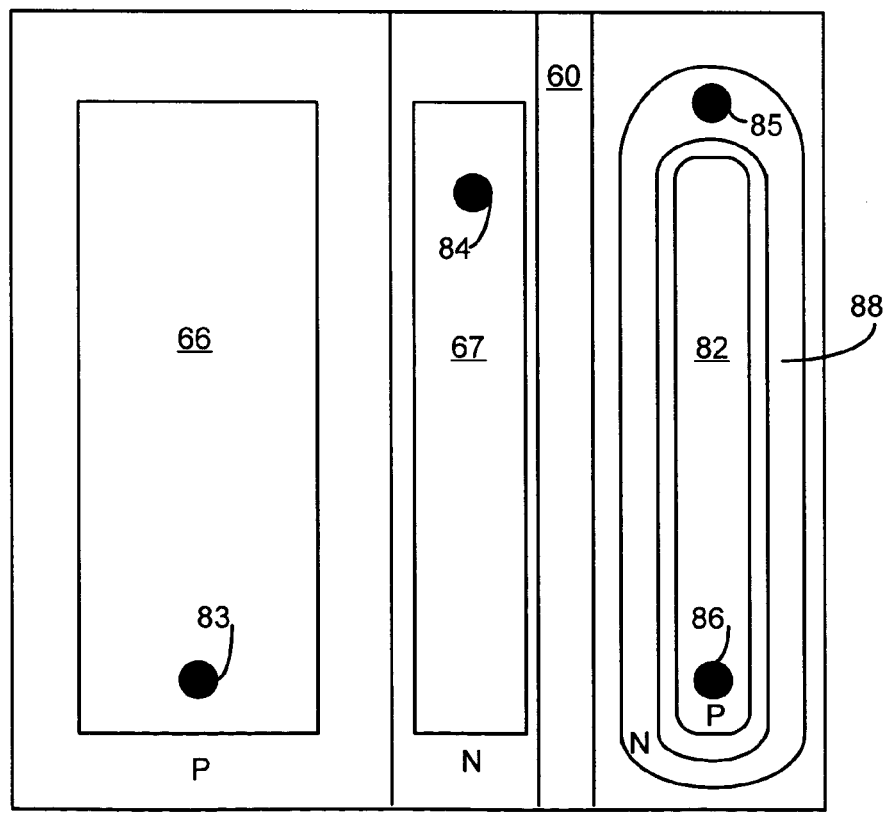
FIG. 8 is another embodiment of the structure of FIG. 4 without metal interconnections.

FIG. 8 is a top-down view the ESD diode P-type material completely surrounded by an N-metal portion 88 contacting the underlying N-type material. The configuration of FIG. 8 further reduces the concentration of electric fields and the series resistance.

Figure 9:
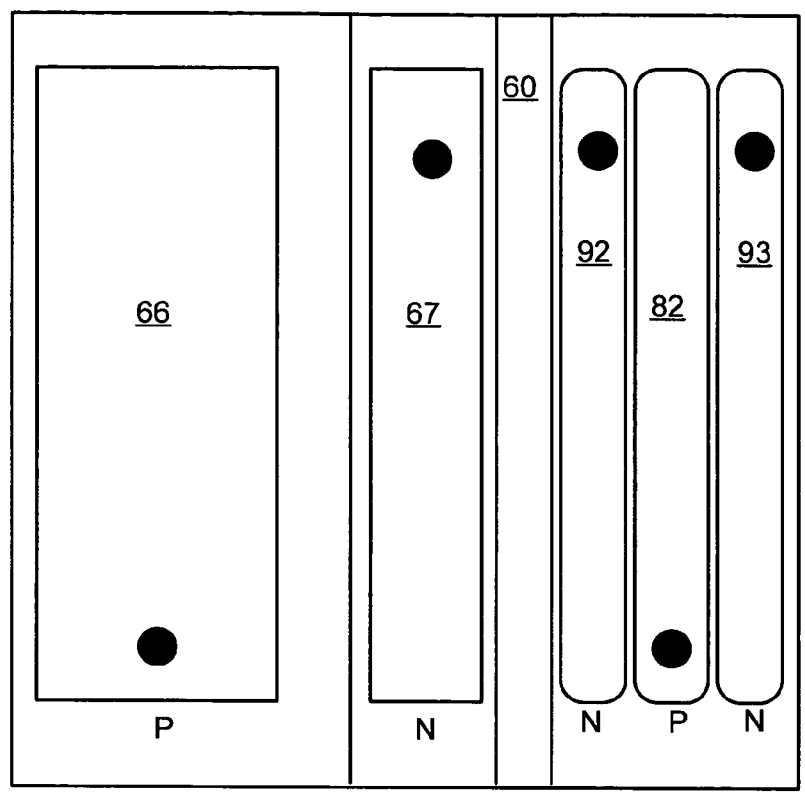
FIG. 9 is another embodiment of the structure of FIG. 4 without metal interconnections.

FIG. 9 illustrates another embodiment where the ESD diode N-type material is exposed on both sides of the P-type material and contacted by metal portions 92 and 93. This effectively reduces the series resistance by 50 percent as compared to the configuration of FIG. 6.

Any of the devices described herein may be the type where the light is emitted upward through the P-type region, and the substrate is affixed to a reflective cup and heat sink. Wires extend from the top surface of the chip to terminals of the package. The metal contacts for the light emitting diode portion may form interdigitated fingers, or be thin strips, or have holes, or be very thin and transparent so as to reduce the blocking of light by the metal.

Figure 10:
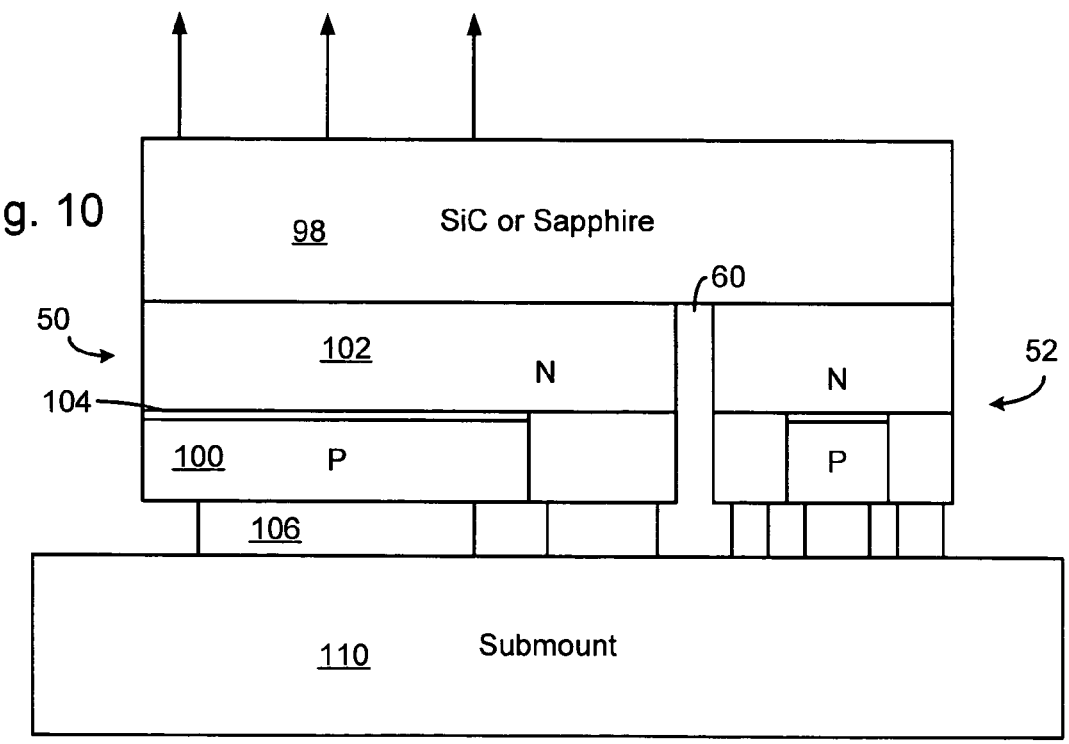
FIG. 10 is a cross-sectional view of a simplified flip chip LED and ESD diode, that may employ any of the features described herein, mounted on a submount.

To eliminate the blocking of the light by the wire bonds and various metal layers, the LED may be a flip chip type, such as shown in FIG. 10. In FIG. 10, the substrate 98 is a transparent substrate 98, such as SiC or sapphire. A SiC or sapphire substrate is used as a growth substrate for GaN based LEDs. The light output is upwards through the transparent substrate 98. A reflective layer (e.g., silver) may be deposited on the bottom of the flip chip to reflect light upward toward the substrate. The LED diode 50 and ESD diode 52 are isolated from one another by a trench 60. The epitaxial P-type layer 100 is etched to expose the underlying N-type layer 102 for metal contact. An active layer 104 is shown between the N and P layers 102 and 100 to enhance the light output. The active layer may be deleted between the N and P-type layers in the ESD diode 52.

Conductive material 106, such as combinations of metal layers and high conductivity semiconductor layers, provide a flat contact surface of the LED chip for connection to a submount 110. Techniques for forming flip chips are described in U.S. Pat. No. 6,521,914 to Michael Krames et al., incorporated herein by reference. Submount 110 comprises a silicon chip on which is formed metal contact pads, for electrically contacting the electrodes on the LED chip, and various interconnections to form the anti-parallel configuration of FIG. 4 and provide terminals connected to pins of the LED package. The solder bumps shown in FIGS. 7–9 may be directly connected to the metal contact pads on the submount 110. The LED package typically comprises an enclosure, a lens, terminals, and other structures.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A light emitting device comprising:
a light emitting diode (LED), formed by semiconductor materials on a substrate, that emits light by application of a forward bias voltage to terminals of the LED;
an electrostatic discharge (ESD) protection diode, formed by semiconductor materials on the substrate, the ESD protection diode for being connected in an anti-parallel configuration to the LED for protecting the LED from damage by shunting current away from the LED when a reverse bias voltage above a threshold level is applied to the terminals of the LED,
the ESD protection diode comprising a junction of N-type material and P-type material forming a PN junction, wherein a length of the PN junction is at least twice a width of the PN junction, and wherein an area of the substrate taken up by the ESD protection diode is less than 30% of the total area taken up by the LED and ESD protection diode on the substrate; and
a metal layer portion contacting the N-type material at least along 50% of the length of the PN junction,
wherein a surface area of the ESD protection diode is 60,000–100,000 square microns.

2. A light emitting device comprising:
a light emitting diode (LED), formed by semiconductor materials on a substrate, that emits light by application of a forward bias voltage to terminals of the LED;
an electrostatic discharge (ESD) protection diode, formed by semiconductor materials on the substrate, the ESD protection diode for being connected in an anti-parallel configuration to the LED for protecting tile LED from damage by shunting current away from the LED when a reverse bias voltage above a threshold level is applied to the terminals of the LED,
the ESD protection diode comprising a junction of N-type material and P-type material forming a PN junction, wherein a length of the PN junction is at least twice a width of the PN junction, and wherein an area of the substrate taken up by the ESD protection diode is less than 30% of the total area taken up by the LED and ESD protection diode on the substrate; and
a metal layer portion contacting the N-type material at least along 50% of the length of the PN junction,
wherein the area of the substrate taken up by the ESD protection diode is less than 10% of the total area taken up by the LED and ESD protection diode on the substrate.

3. A light emitting device comprising:
a light emitting diode (LED), formed by semiconductor materials on a substrate, that emits light by application of a forward bias voltage to terminals of the LED;
an electrostatic discharge (ESD) protection diode, formed by semiconductor materials on the substrate, the ESD protection diode for being connected in an anti-parallel configuration to the LED for protecting the LED from damage by shunting current away from the LED when a reverse bias voltage above a threshold level is applied to the terminals of the LED,
the ESD protection diode comprising a junction of N-type material and P-type material forming a PN junction, wherein a length of the PN junction is at least twice a width of the PN junction, and wherein an area of the substrate taken up by the ESD protection diode is less than 30% of the total area taken up by the LED and ESD protection diode on the substrate; and
a metal layer portion contacting the N-type material at least along 50% of the length of the PN junction,
wherein the metal layer portion contacting the N-type material substantially surrounds the P-type material.

4. A light emitting device comprising:
a light emitting diode (LED), formed by semiconductor materials on a substrate, that emits light by application of a forward bias voltage to terminals of the LED;
an electrostatic discharge (ESD) protection diode, formed by semiconductor materials on the substrate, the ESD protection diode for being connected in an anti-parallel configuration to the LED for protecting the LED from damage by shunting current away from the LED when a reverse bias voltage above a threshold level is applied to the terminals of the LED,
the ESD protection diode comprising a junction of N-type material and P-type material forming a PN junction, wherein a length of the PN junction is at least twice a width of the PN junction, and wherein an area of the substrate taken up by the ESD protection diode is less than 30% of the total area taken up by the LED and ESD protection diode on the substrate; and
a metal layer portion contacting the N-type material at least along 50% of the length of the PN junction,
wherein the metal layer portion contacting the N-type material completely surrounds the P-type material.

5. A light emitting device comprising:
a light emitting diode (LED), formed by semiconductor materials on a substrate, that emits light by application of a forward bias voltage to terminals of the LED;
an electrostatic discharge (ESD) protection diode, formed by semiconductor materials on the substrate, the ESD protection diode for being connected in an anti-parallel configuration to the LED for protecting the LED from damage by shunting current away from the LED when a reverse bias voltage above a threshold level is applied to the terminals of the LED,
the ESD protection diode comprising a junction of N-type material and P-type material forming a PN junction, wherein a length of the PN junction is at least twice a width of the PN junction, and wherein an area of the substrate taken up by the ESD protection diode is less than 30% of the total area taken up by the LED and ESD protection diode on the substrate; and
a metal layer portion contacting the N-type material at least along 50% of the length of the PN junction,
wherein the metal layer portion contacting the N-type material contacts the N-type material on at least two sides of the P-type material.

6. The device of claim 1 wherein an active region is formed at the PN junction.

7. The device of claim 1 wherein the LED and the ESD protection diode are interconnected by metal layer portions formed over the surface of the LED and ESD protection diode.

8. The device of claim 1 wherein the LED and the ESD protection diode are interconnected by conductors in a package external to the LED and the ESD protection diode.

9. The device of claim 1 wherein the LED and the ESD protection diode are interconnected by conductors on a submount external to the LED and the ESD protection diode.

10. The device of claim 1 wherein a surface area of the LED and ESD protection diode is less than 1 mm².

11. The device of claim 1 wherein a surface area of the LED and ESD protection diode is greater than 1 mm².

12. A light emitting device comprising:
a light emitting diode (LED), formed by semiconductor materials on a substrate, that emits light by application of a forward bias voltage to terminals of the LED;
an electrostatic discharge (ESD) protection diode, formed by semiconductor materials on the substrate, the ESD protection diode for being connected in an anti-parallel configuration to the LED for protecting the LED from damage by shunting current away from the LED when a reverse bias voltage above a threshold level is applied to the terminals of the LED,
the ESD protection diode comprising a junction of N-type material and P-type material forming a PN junction, wherein a length of the PN junction is at least twice a width of the PN junction, and wherein an area of the substrate taken up by the ESD protection diode is less than 30% of the total area taken up by the LED and ESD protection diode on the substrate; and
a metal layer portion contacting the N-type material at least along 50% of the length of the PN junction,
wherein a surface area of the ESD protection diode is 20,000–60,000 square microns.

13. The device of claim 2 wherein a surface area of the ESD protection diode is 60,000–100,000 square microns.

14. The device of claim 1 further comprising a trench between the LED and the ESD protection diode for isolating the LED and ESD protection diode.

15. The device of claim 1 wherein the LED and ESD protection diode are gallium nitride based diodes.

16. The device of claim 1 wherein the LED and ESD protection diode form a flip chip.

17. A light emitting device comprising:
a light emitting diode (LED), formed by semiconductor materials on a substrate, that emits light by application of a forward bias voltage to terminals of the LED;
an electrostatic discharge (ESD) protection diode, formed by semiconductor materials on the substrate, the ESD protection diode for being connected in an anti-parallel configuration to the LED for protecting the LED from damage by shunting current away from the LED when a reverse bias voltage above a threshold level is applied to the terminals of the LED,
the ESD protection diode comprising a junction of N-type material and P-type material forming a PN junction, wherein a length of the PN junction is at least twice a width of the PN junction, and wherein an area of the substrate taken up by the ESD protection diode is less than 30% of the total area taken up by the LED and ESD protection diode on the substrate; and
a metal layer portion contacting the N-type material at least along 50% of the length of the PN junction,
wherein at least a portion of the PN junction has rounded corners.

18. A method for firming a light emitting device comprising:
forming a light emitting diode (LED) on a substrate, the LED emitting light by application of a forward bias voltage to terminals of the LED;
forming an electrostatic discharge (ESD) protection diode on the substrate, the ESD protection diode for being connected in an anti-parallel configuration to the LED for protecting the LED from damage by shunting current away from the LED when a reverse bias voltage above a threshold level is applied to the terminals of the LED,
the ESD protection diode comprising a junction of N-type material and P-type material forming a PN junction, wherein a length of the PN junction is at least twice a width of the PN junction, and wherein an area of the substrate taken up by the ESD protection diode is less than 30% of the total area taken up by the LED and ESD protection diode on the substrate; and
forming a metal layer portion contacting the N-type material at least along 50% of the length of the PN junction,
wherein the area of the substrate taken up by the ESD protection diode is less than 10% of the total area taken up by the LED and ESD protection diode on the substrate.

19. The method of claim 18 wherein the metal layer portion contacts the N-type material at least along 75% of the length of the PN junction.

20. A method for forming a light emitting device comprising:
forming a light emitting diode (LED) on a substrate, the LED emitting light by application of a forward bias voltage to terminals of the LED;
forming an electrostatic discharge (ESD) protection diode on the substrate, the ESD protection diode for being connected in an anti-parallel configuration to the LED for protecting the LED from damage by shunting current away from the LED when a reverse bias voltage above a threshold level is applied to the terminals of the LED,
the ESD protection diode comprising a junction of N-type material and P-type material forming a PN junction, wherein a length of the PN junction is at least twice a width of the PN junction, and wherein an area of the substrate taken up by the ESD protection diode is less than 30% of the total area taken up by the LED and ESD protection diode on the substrate; and
forming a metal layer portion contacting the N-type material at least along 50% of the length of the PN junction,
wherein a surface area of the ESD protection diode is 20,000–60,000 square microns.

21. A method for forming a light emitting device comprising:
forming a light emitting diode (LED) on a substrate, the LED emitting light by application of a forward bias voltage to terminals of the LED;
forming an electrostatic discharge (ESD) protection diode on the substrate, the ESD protection diode for being connected in an anti-parallel configuration to the LED for protecting the LED from damage by shunting current away from the LED when a reverse bias voltage above a threshold level is applied to the terminals of the LED,
the ESD protection diode comprising a junction of N-type material and P-type material forming a PN junction, wherein a length of the PN junction is at least twice a width of the PN junction, and wherein an area of the substrate taken up by the ESD protection diode is less than 30% of the total area taken up by the LED and ESD protection diode on the substrate; and forming a metal layer portion contacting the N-type material at least along 50% of the length of the PN junction, wherein a surface area of the ESD protection diode is 60,000–100,000 square microns.

22. The method of claim 21 wherein the area of the substrate taken up by the ESD protection diode is less than 10% of the total area taken up by the LED and ESD protection diode on the substrate.

* * * * *